United States Patent [19]

Deal et al.

[11] 4,027,380
[45] June 7, 1977

[54] COMPLEMENTARY INSULATED GATE FIELD EFFECT TRANSISTOR STRUCTURE AND PROCESS FOR FABRICATING THE STRUCTURE

[75] Inventors: Bruce E. Deal, Palo Alto; Daniel C. Hu, San Jose, both of Calif.

[73] Assignee: Fairchild Camera and Instrument Corporation, Mountain View, Calif.

[22] Filed: Jan. 16, 1976

[21] Appl. No.: 649,957

Related U.S. Application Data

[62] Division of Ser. No. 475,358, June 3, 1974, abandoned.

[52] U.S. Cl. .................................. 29/571; 29/578; 357/42; 357/90
[51] Int. Cl.² ........................................ B01J 17/00
[58] Field of Search ............... 29/571, 578; 357/90, 357/42

[56] References Cited

UNITED STATES PATENTS

| 3,328,210 | 6/1967 | McCaldin | 29/571 |
| 3,798,079 | 3/1974 | Chu | 357/90 |
| 3,921,283 | 11/1975 | Shappir | 29/571 |

OTHER PUBLICATIONS

IBM Technical Disclosure Bulletin, "Stacking Fault Free Epitaxial Layers," by Edel, p. 1654, vol. 14, No. 5, Oct. 1971.

Primary Examiner—W. Tupman
Attorney, Agent, or Firm—Alan H. MacPherson; Henry K. Woodward; Norman E. Reitz

[57] ABSTRACT

A complementary insulated gate field effect transistor structure having complementary p-channel and n-channel devices in the same semiconductor substrate and a process for fabricating the structure incorporate oxide isolation of the active device regions, counter-doping of the p-well with impurities of opposite type to obtain a composite doping profile, reduction of $Q_{ss}$ in the isolation oxide, doping of the gate and field oxides with a chlorine species and phosphorus doping of the polycrystalline silicon gates.

3 Claims, 8 Drawing Figures

COMPLEMENTARY INSULATED GATE FIELD EFFECT TRANSISTOR STRUCTURE AND PROCESS FOR FABRICATING THE STRUCTURE

This is a division of application Ser. No. 475,358 filed June 3, 1974, now abandoned.

This invention relates to complementary insulated gate field effect transistor structures and processes for fabricating such structures, and more particularly to an improved insulated gate field effect transistor structure and a process for fabricating the structure which incorporate oxide isolation of active device regions such as the isoplanar oxide isolation as described in U.S. Pat. No. 3,648,125 issued to Peltzer, counterdoping of the p-well with impurities of opposite type to obtain a composite doping profile, reduction of $Q_{ss}$ in the isoplanar oxide, doping of the gate and field oxides with a chlorine species, and phosphorus doping of the polycrystalline silicon gates.

BACKGROUND OF THE INVENTION

Complementary field effect circuit arrangements employ an n-channel and a p-channel field effect transistor which are coupled so that the source or drain of one device is connected to the source or drain of the other device. In any mode of circuit operation, one of the devices will be functioning and the other will be off. When operating conditions within the circuit dictate that the functioning device turns off, the device which was previously off will begin to function due to interconnection of the sources and/or drains of the two devices. This concept was first disclosed by Wanlass in U.S. Pat. No. 3,356,858. It is especially useful because no additional power is required to switch either of the devices. Switching is an inherent attribute of circuit operation.

Conventional complementary field effect devices are fabricated as conductor-insulator-semiconductor structures with interconnections between particular sources or drains of the n-channel and p-channel devices. The conductors may be metal or conductive polycrystalline silicon. Silicon dioxide is the most widely used insulator and single crystal silicon is the most widely used semiconductor substrate. Typical complementary metal oxide semiconductor (CMOS) structures are fabricated on an n-type substrate rather than on a p-type substrate because it is easier to obtain desirable threshold voltages for both the n-channel and p-channel complementary devices. The p-well required for the n-channel complement is obtained by diffusing a lightly doped p-region into the n-type substrate. In some devices all n-channel devices are fabricated in a common p-well, and p-channel devices are fabricated in the n-substrate so that much of the overall area is taken up with interconnections between the n-channel and p-channel devices. Where individual p-wells are used for the n-channel devices, isolation of the p-channel field effect transistors is sometimes achieved by heavily doped channel stops. These channel stops occupy a large amount of wafer surface area, degrade operating speed and limit the voltage range. Recently, polycrystalline silicon has been used in place of metal for the gate electrodes of the devices, but although transient performance is slightly improved, a negligible reduction in area has been effected. Also, the standard dopant, boron, which is placed in the polycrystalline silicon to render it conductive and to obtain a low threshold, possesses the property that it may diffuse through the gate oxide in the presence of hydrogen and degrade the device. And, prior-art CMOS devices are known to experience impurity migration through both the gate and field oxides with resultant impairment in the operating characteristics of the devices. Finally, the presence of uncontrolled amounts of fixed surface states charges, due typically to non-stoichiometric composition of the $SiO_2$, also impairs the operating characteristics of the devices.

SUMMARY OF THE INVENTION

The invention described herein overcomes the known deficiencies of conventional CMOS structures. Further, the structure exhibits many other significant advantages over conventional metal gate non-oxide-isolated CMOS circuits. The disclosed structure has a broad operating range of approximately 3 to 15 volts, increased packing density, greater device stability and better control of threshold values for the respective devices.

A complementary insulated gate field effect transistor structure has n-channel and p-channel conductor-insulator-semiconductor devices formed in the same semiconductor substrate and includes a semiconductor substrate of a first conductivity type having a major surface, a composite conductivity well in the substrate which occupies a portion of the major surface, the composite well containing impurities of a first conductivity type and of a second conductivity type opposite to the first conductivity type to produce a net conductivity of said second type which is low near the major surface to provide a low threshold for a device within the well and high deep within the well to produce high breakdown voltages across the well/substrate junction, a first conductor-insulator-semiconductor field-effect device having a first type channel conductivity and having a pair of source/drain regions of the first conductivity type located in spaced-apart relation in the surface of the composite conductivity well adjacent the major surface, a first gate insulating material overlying the portion of the major surface occupied by the well and spanning the distance between the pair of source/drain regions of the first conductivity type, and a first gate electrode overlying the first gate insulating material, a second conductor-insulator-semiconductor field-effect device having a second type channel conductivity and having a pair of source/drain regions of the second conductivity type in spaced-apart relation adjacent the major surface of the semiconductor substrate, a second gate insulating material overlying the major surface of the semiconductor substrate and spanning the distance between the pair of source/drain regions of the second conductivity type, and a second gate electrode overlying the second gate insulating material, and isolation regions formed contiguous with the semiconductor substrate and around the first and second conductor-insulator-semiconductor devices.

The present invention further comprises a process for fabricating a complementary insulated gate field-effect transistor structure having n-channel and p-channel devices in the same semiconductor substrate, comprising the steps of forming isolation regions in selected portions of a semiconductor substrate adjacent a major surface thereof, the substrate having a first conductivity type and the isolation regions substantially surrounding first and second active device regions, each of the active device regions occupying portions of the major surface, forming a composite conductivity well in the first active device region in the semiconductor substrate by introducing impurities of the first conductivity type and of a second conductivity type opposite to the first conductivity type to produce a net conductivity concentration of the second conductivity type which is low near the major surface to provide a low threshold for a device within the well and high deep within the well to produce high breakdown voltages across the well/substrate junction, forming a conductor-insulator-semiconductor field-effect device having a first channel conductivity type within the composite well in the first active device region, and forming a conductor-insulator-semiconductor field-effect device having a second channel conductivity type in the second active device region within the substrate.

The present invention further comprises a process for fabricating a complementary insulated gate field-effect transistor structure wherein p-channel and n-channel devices are formed within the same semiconductor substrate, comprising the steps of applying a thermal oxidation masking material to a layer of n-types silicon, defining the thermal oxidation material to establish protected active device regions and to open up isoplanar isolation regions, introducing a lightly doped n-type impurity in the substrate in the isoplanar isolation regions, heating the semiconductor substrate in the presence of an oxidizing agent to form isolation islands of silicon dioxide, removing the thermal oxidation masking material, predepositing n-type and p-type impurities in at least one active device region, heating the substrate to drive the n-type and p-type impurities into the substrate to form a composite conductivity well, the relative concentration of the n-type and p-type impurities producing a low net p-type concentration near the surface of the well and a high net p-type concentration deep within the well, thermally growing a thin layer of silicon dioxide in the active device regions, depositing a conductive layer of polycrystalline silicon, defining the layers of silicon dioxide and polycrystalline silicon to produce insulated gate electrodes for the p-channel and n-channel devices, predepositing boron adjacent both sides of a defined gate electrode in an active device region formed in the layer of n-type silicon to form the source/drain regions of a p-channel field-effect device, predepositing phosphorus adjacent both sides of a defined gate electrode in an active device region formed in the composite well to produce the source/drain regions of an n-channel field-effect device, thermally driving in the impurities predeposited in the source/drain regions of the p-channel and n-channel devices, forming a further layer of electrical insulation over the isolation islands and applying a conductive layer and defining said conductive layer to connect one of the source/drain regions of the p-channel field-effect device and one of the source/drain regions of the n-channel field-effect device and to effect external electrical coupling with the remaining source/drain regions of the n-channel and p-channel field-effect devices.

BRIEF DESCRIPTION OF THE DRAWINGS

For a more complete understanding of the structure and process of the present invention, reference may be had to the drawings which are incorporated herein by reference and in which.

DESCRIPTION OF THE PREFERRED EMBODIMENTS

Figure 1:
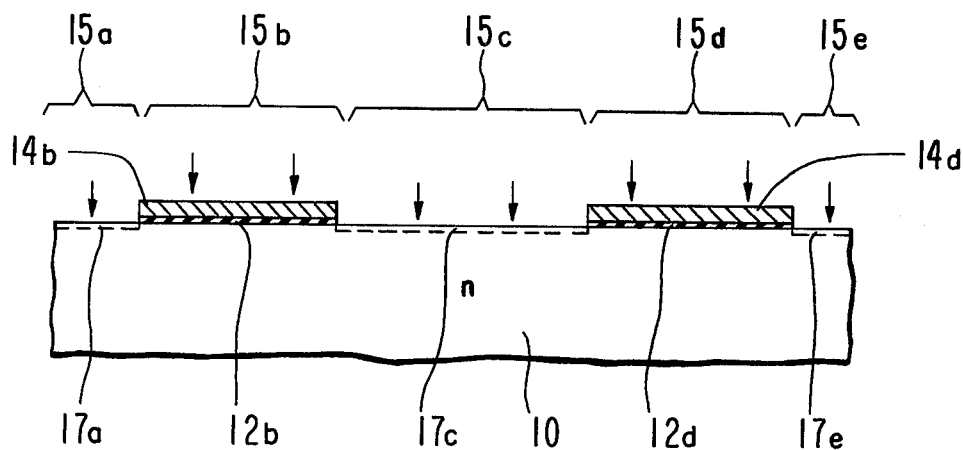
FIG. 1 illustrates an intermediate process step after selective formation of layers of silicon dioxide 12b and 12d on n-substrate 10, selective formation of layers of oxidation masking material 14b and 14d, and introduction of a field implant to regions 17a, 17c and 17e.

Referring now to FIG. 1, the substrate 10 is shown, in this preferred embodiment, to be n-conductivity-type silicon. With an n-conductivity-type substrate and associated p-well, the threshold voltages of the two complementary devices are matched more closely than is possible for devices in a p-conductivity-type substrate and associated n-well, if the compensating effect of p-well implantation is considered. Complementary devices formed in a p-type substrate with an associated n-well could have matched threshold voltages provided an additional impurity was introduced underneath the gate of the p-channel device. With this proviso, the disclosure herein of complementary field-effect devices formed in an n-substrate and associated p-well also pertains to complementary field-effect devices formed in a p-substrate and associated n-well with the appropriate substitution of analogous process steps.

A layer of oxidation masking material 14 is applied to the surface of substrate 10. This material serves to mask the active device regions while isolation regions are grown. It has been found advantageous to interpose a layer of silicon dioxide 12 between oxidation masking material 14 and the silicon substrate 10 in order to prevent the creation of defects in the substrate upon cooling and to provide a more desirable geometry to the isoplanar oxide islands. The inclusion of a silicon dioxide layer 12 appears to reduce structural stresses experienced by the substrate upon cooling. For example, if the oxidation masking material 14 is silicon nitride, Si₃N₄, the silicon dioxide layer 12 will be in a state of compression while the silicon nitride 14 will be in a state of tension with respect to the silicon substrate due to the differences in coefficient of thermal expansion. The countervailing forces may protect the substrate. As shown, both the silicon dioxide and the silicon nitrode are defined by carrying out a photoresist masking sequence to protect active device regions 15b and 15d and to expose isolation regions 15a, 15c and 15e.

As used above and throughout this specification, the phrase "photoresist masking sequence" refers to the well-known sequence of applying a uniform layer of a photoresist polymer, selectively exposing the photoresist by radiation of appropriate wavelength, developing the photoresist to leave a desired pattern, performing an active step such as diffusion or forming metal contacts, and removing the photoresist polymer. A complete photoresist masking sequence is also called a masking step. The details of each individual dual masking step are not shown in the drawings and should be inferred from the use of the term "masking step."

An n-type field implant, typically arsenic, is then introduced into isolation regions 15a, 15c and 15e. Preferably the field implant is introduced by ion implantation because the dosage and energy of implantation can be carefully controlled. In one embodiment a field implantation energy of 40KeV is employed. The field implant may also be introduced by diffusion. In either case, the impurity atoms enter the surface of the substrate and repose at a shallow depth. This step is called predeposition. The silicon nitride overlying the silicon dioxide in the active device regions 15b and 15d masks the substrate regions and prevents any of the field implant impurity from reaching substrate 10. When driven into the substrate, such a field implant slightly raises the surface concentration of n-type impurities in the n-substrate 10 and prevents inversion of the substrate underneath the isolation regions. Such inversion would occur between p-type source/drain regions of the p-channel device and the p-well, i.e., between source/drain region 36d and p-well 23d of FIG. 4. In effect, the implant forms a channel stop but requires much less surface area. The concentration of the field implant is typically about one order of magnitude lower than either the substrate or p-well concentrations so that even though the n-type implant reduces the p-conductivity-type concentration and enhances the likelihood of inversion of the p-well between the n-type source/drain regions of the n-channel device and the n-substrate 10, the p-well is relatively so heavily doped beneath shallow well depths that the net p-type concentration under the isolation islands remains high enough to prevent inversion of the p-well for voltages up to about 25 volts.

Figure 2:
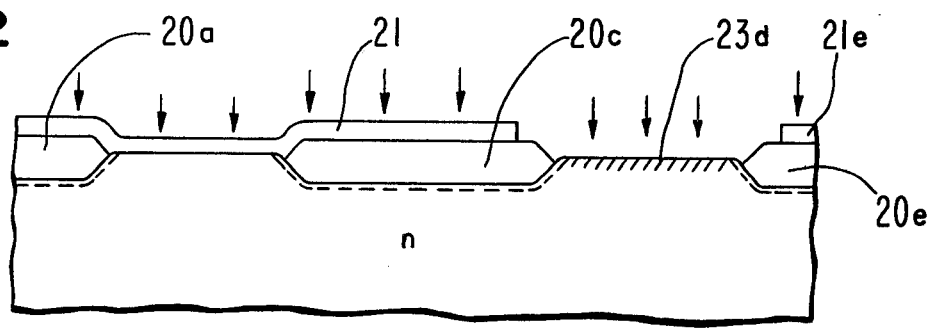
FIG. 2 is a further view of FIG. 1 after growth of isoplanar isolation oxide 20a, 20c and 20e, removal of oxidation masking material 14b, and 14d and layers of silicon dioxide 12b and 12d, and application of photoresist layer 21 and introduction of p-well double ion implant 23d.

Referring now to FIG. 2, isolation islands 20 are formed in isolation regions 15a, 15c and 15e. Several versions of oxide isolation have been developed commercially. Generally, they include surrounding active device regions with thick layers of silicon dioxide, also called field oxide. The isoplanar process as set forth in U.S. Pat. No. 3,648,125 is one such process. In the isoplanar process, silicon dioxide is grown from the silicon substrate by application of an oxidizing agent such as oxygen or water vapor at a temperature in the range of 900°–1250° C. In one embodiment, a 1.8μ layer of isolation oxide is grown by subjecting the substrate to a temperature of 1000° C. in a wet oxygen ambient for 16 hours. The general thermal oxidation kinetics of this silicon dioxide growth have been reported previously. See B. E. Deal and A. S. Grove, "General Relationship for the Thermal Oxidation of Silicon." *Journal of Applied Physics*, V.36, No. 12, pp. 3770–3778 (1965). The silicon dioxide grows into and rises above the surface of the substrate to form isolation islands 20a, 20c and 20e which surround (in a three-dimensional structure) active device regions 15b and 15d. The predeposited field implant moves into the substrate ahead of the expanding mass of silicon dioxide and, due to the elevated temperature, is dispersed even further into the substrate as shown by region 17c of FIG. 3. Oxidation masking material 14 serves to prevent oxidation in the active device regions 15b and 15d. After formation of isolation islands 20, the masking material 14 along with the underlying silicon dioxide 12 is stripped by well-known etching techniques.

Figure 8:
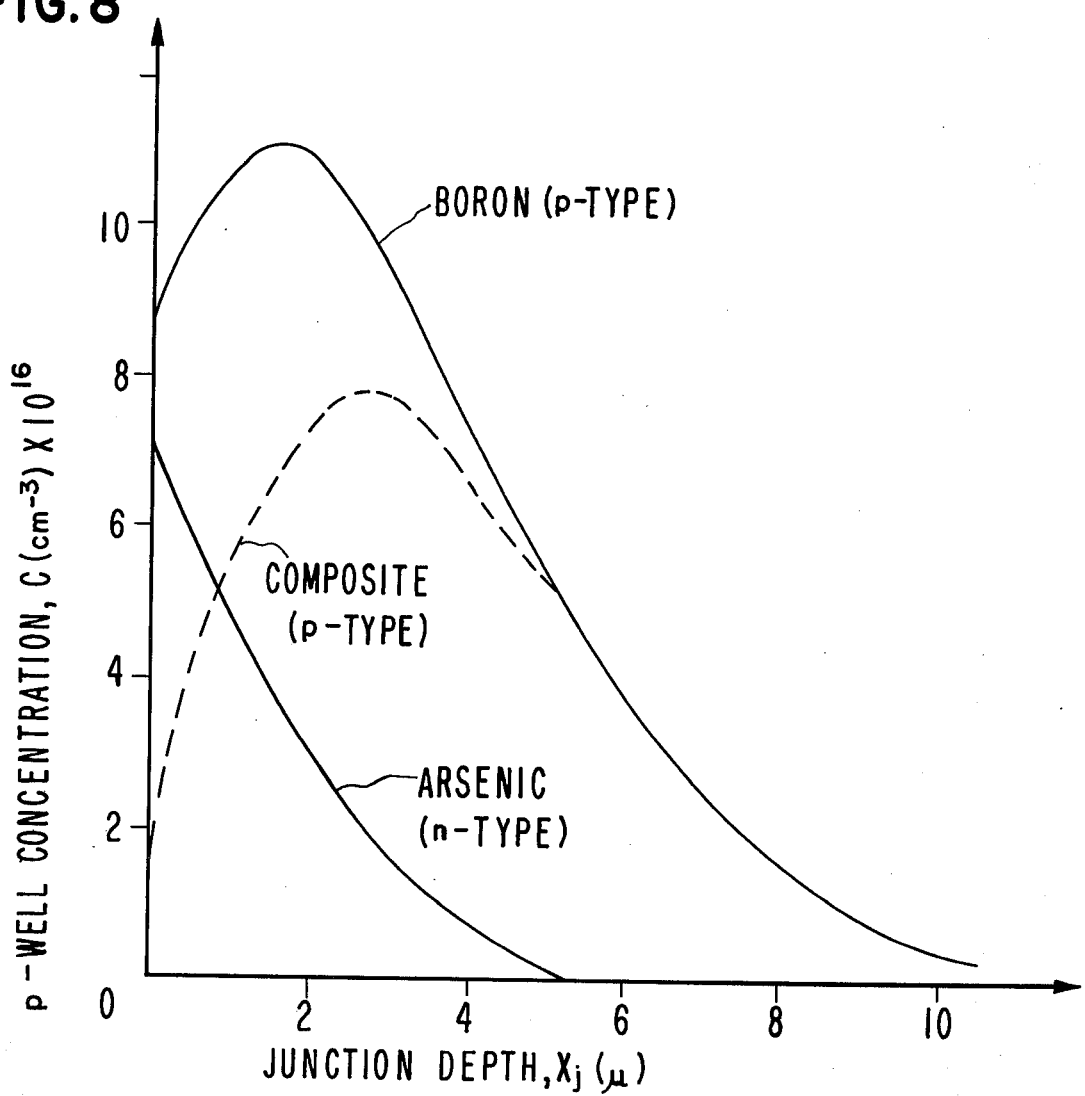
FIG. 8 is a graph illustrating the composite impurity concentration in the p-well as a result of the counterdoping procedure.

Next, a masking step as evidenced by a layer of photoresist 21 is performed to permit the predeposition of impurities in the p-well region. Both p-type and n-type impurities are introduced to the substrate and then thermally driven in. This counterdoping procedure produces a highly desirable doping profile. The concentration of the p-type impurities in the profile achieved is great enough deep within the well so that inversion of the p-well between the n-type substrate and the n-type source/drain regions of the n-channel device will not occur until very high voltages, on the order of 25 volts, are reached, even after the n-type field implant is considered. And, the concentration of the p-type impurities in the profile is low enough between the two n-type source/drain regions so that the n-channel device will operate at a suitably low threshold voltage on the order of 1.5 volts. These two features of the doping profile are shown by the composite profile (dotted line) of FIG. 8. They are achieved by counterdoping a p-type impurity with an n-type impurity in active device region 15d. In effect, the n-type impurity is doped of the p-type impurity to lower the p-type concentration near the surface. As shown in FIG.. 8, the p-type impurity, boron, is introduced and thermally driven in. Then, a lesser amount of an n-type impurity, arsenic, is introduced and thermally driven in. Ion implantation is the preferred method of introduction because the dosage rate and energy of implantation can be carefully controlled. The thermal drive-in step theoretically could be omitted if a suitably high energy of implantation is achieved, but as a matter of practicality will usually be used. In this embodiment the boron is implanted at an energy of 80 KeV and reaches a predeposition depth of about 0.3–0.4μ while the arsenic is implanted at an energy of 170 KeV and reaches a predeposition depth of about 0.1μ. When thermally driven in, the boron reaches a depth of about 10μ and the arsenic reaches a depth of about 4μ and counterdopes the boron to produce the desired composite concentration profile. In an alternative embodiment, the arsenic and boron are introduced simultaneously and thermally driven in together. In the subsequent drive-in diffusion, advantage is taken of the approximate 2 : 1 ratio in diffusivity of boron to arsenic to obtain essentially a p-type profile deep within the well and a low p-type concentration near the surface. Other n-type impurities may be used in the same manner so long as the composite doping profile described herein is obtained. Prior attempts to obtain such a composite profile have involved contrived and complicated techniques which generally have been unsatisfactory. The process of the present invention achieves the desired composite profile in a reliable and reproducible manner.

Figure 3:
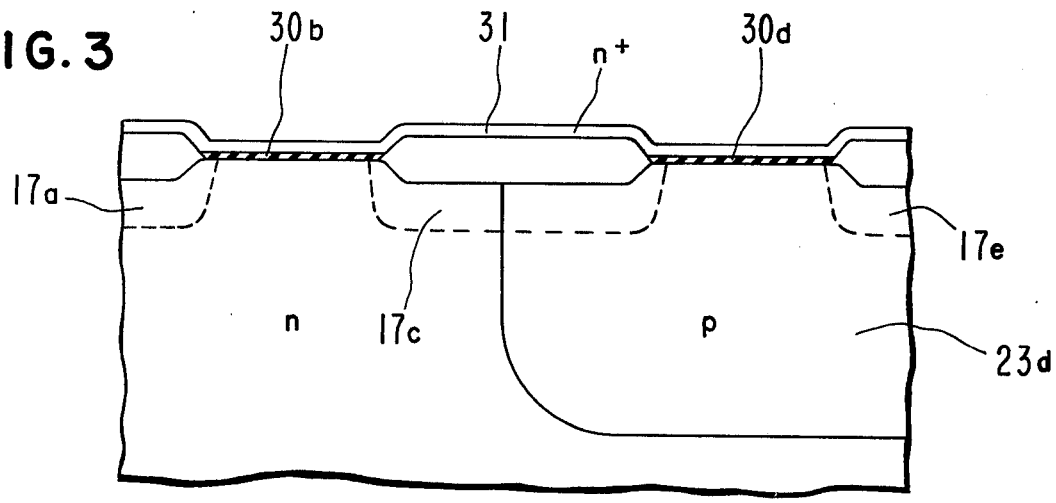
FIG. 3 is a further view of FIG. 2 after thermal drive-in of the p-well implant to form p-well 23d and of the field implant to form expanded field implant regions 17a, 17c and 17e, growth of the gate oxide layers 30b and 30d, and deposition of polycrystalline silicon layer 31.

The drive-in of the two impurities in the p-well is shown to be completed in FIG. 3. This drive-in diffusion is accomplished after stripping the photoresist 21. The drive-in is typically accomplished at high temperatures on the order of 1200° C. in inert atmospheres such as nitrogen. In one aspect of the process of the present invention, a small amount of oxygen is introduced to the inert atmosphere to prevent the accumulation of positive charge $Q_{ss}$ in the isolation oxide 20. The positive charge $Q_{ss}$ in the silicon dioxide near the silicon/silicon dioxide interface has been found to be caused by the generation of deficiency sites or ionized silicon species in the silicon dioxide during the high-temperature anneal of the drive-in diffusion of the double ion implant. The high-temperature anneal produces deficiency sites in the silicon dioxide, e.g., sites at which $SiO^+$ radicals are formed by driving out oxygen atoms. The presence of these positive charges in high enough concentration can lead to inversion of the p-well, causing leakage between the two $n^+$-source/drain regions or between the $n^+$-source/drain regions and the n-substrate. It has been found that an atmosphere of about 98 percent $N_2$ and 2% $O_2$ during p-well drive-in will reduce $Q_{ss}$ to a level at which the n-channel device will operate at voltages greater than 15 volts without inversion between the $n^+$-source/drain regions and the n-substrate. Preferably the $Q_{ss}$ concentration is reduced to $1 \times 10^{11}/cm^2$ or less in order to be able to operate the n-channel device at voltages up to 25 volts without this inversion. It has also been found that $Q_{ss}$ concentrations of $2 \times 10^{11}/cm^2$ will reduce the operating limit of the n-channel device from about 25 volts to about 15 volts. It has been found that after p-well drive-in, a treatment with water vapor will further reduce $Q_{ss}$ by filling in additional deficiency sites. While water vapor would work to fill in deficiency sites during p-well drive-in, there is an undesirable side effect of catalyzing additional oxide growth. In an ancillary embodiment, water vapor is subsequently applied at a temperature in the range of 700°–1000° C. to further fill in deficiency sites.

The preferred $Q_{ss}$ concnetration recited above approaches the residual concentration at the silicon/silicon dioxide interface produced by the silicon-rich character of the silicon dioxide at the interface. Since the crystal orientation of the substrate determines the number of silicon atoms exposed per unit area on the surface of the planar substrate, the silicon-rich character of the silicon dioxide will depend upon underlying crystal structure. Thus, (100) silicon will have the lowest residual $Q_{ss}$, on the order of $5 \times 10^{10}/cm^2$ and is therefore a preferred substrate material. While (110) and (111) orientation silicon have, respectively, approximately twice and three times the residual $Q_{ss}$ and can be used in the process of the present invention, the higher residual $Q_{ss}$ will affect the final $Q_{ss}$ that can be achieved by curing the deficiency sites.

After the p-well drive-in, a layer of gate insulating material 30b and 30d is formed in active device regions 15b and 15d. This gate material is preferably silicon dioxide which is thermally grown to produce desirable interface characteristics with the underlying silicon substrate. This gate material may also be silicon nitride, $Si_3N_4$, or alumina, $Al_2O_3$. A layer of gate-forming conductive material 31 such as appropriately doped polycrystalline silicon is then chemically deposited over all regions of the device. As is well known in the semiconductor fabrication art, polycrystalline silicon can be used as a conductor of holes if impregnated with a p-type impurity, or as a conductor of electrons if impregnated with an n-type impurity. The preferred dopant is phosphorus because the phosphorus forms a layer of glass at the silicon gate/silicon dioxide interface which acts as an alkali barrier and getterer (neutralizer of alkaline radicals). The polycrystalline silicon serves as gate electrodes and as a primary layer of electrical interconnection of a double conductive layer device with aluminum serving as the upper or second layer.

Figure 5:
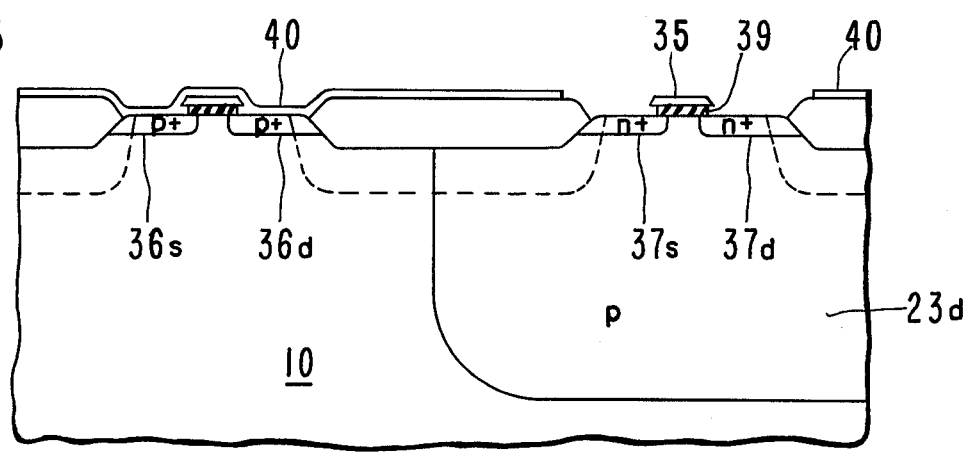
FIG. 5 is a further view of FIG. 4 after application of a thin photoresist layer 40, definition of gate oxide 39 and implantation of $n^+$ impurities in source/drain regions 37.

Since gate insulating material 30 forms the electrical insulation between the conducting gate electrodes of the respective field-effect devices and the semiconductor substrate, its physical characteristics must be closely controlled. For example, if region 30 is silicon dioxide and conductive material 31 is polycrystalline silicon, any sodium in the silicon dioxide insulation constitutes a charge known as $Q_o$ which may impair the performance of the device because it may drift through the silicon dioxide, especially during high bias operation. If and when the $Q_o$ charge drifts through the silicon dioxide, the threshold voltages could be altered. For example, in the CMOS structure of the present invention, acceptable threshold voltage shifts are generally less than one volt while $Q_o$ drift can shift threshold voltages by several volts or more. It has been found that doping the gate oxides with a chlorine species during formation retards such migration. It is not known which particular species is operative but the chlorine species are likely to include, among others, Cl, $Cl_2$, $Cl^-$, $Cl_2^-$, $Cl_2^{--}$. They may be introduced by incorporation of a source of chlorine species such as HCl or trichloroethylene in the oxidizing ambient. In one embodiment the field oxide is similarly doped during thermal oxide growth to further enhance electrical stability by retarding impurity migration. Control and minimization of $Q_{ss}$, the fixed surface state charge, in the gate oxide is also required to provide optimum threshold voltage control for the active devices since it is known that $Q_{ss}$ will shift the threshold voltage in the negative direction. This control is achieved by purging the oxidation ambient with an inert gas such as nitrogen or argon after the gate oxide is substantially formed and then cooling the gate oxide. See FIG. 5 of B. E. Deal et al., "Characteristics of the Surface-State Charge ($Q_{ss}$) of Thermally Oxidized Silicon," *Journal of Electrochemical Society*, Vol. 114, No. 3 (1967).

Figure 4:
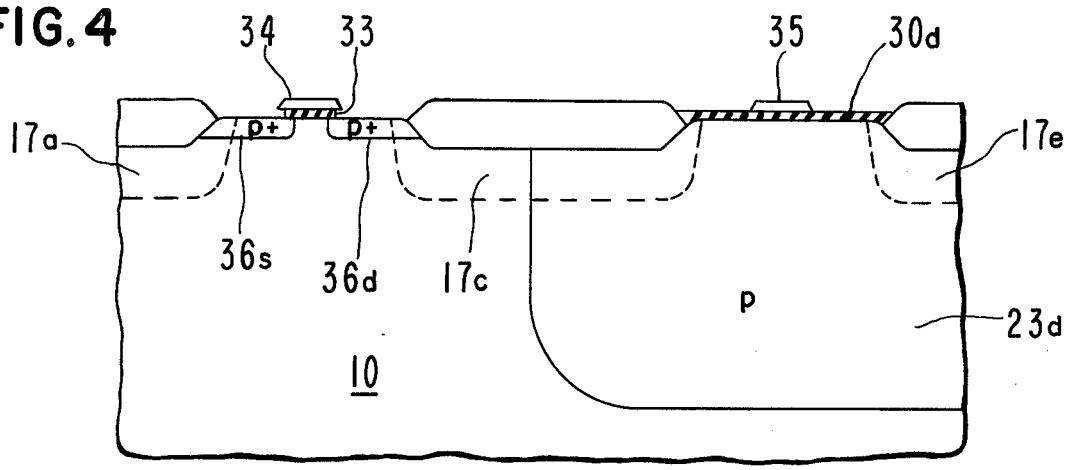
FIG. 4 is a further view of FIG. 3 after definition of the polycrystalline silicon gates 34 and 35, definition of the gate oxide 33, and implantation of $p^+$ impurities in source/drain regions 36.

Referring now to FIG. 4, conductive material 31 and insulating material 30 is defined by a masking step to produce gate electrodes 34 and 35. The edges of the individual gates are configured to allow successive layers to encounter a sloped contour. This sloped contour is achieved by a proprietary buffered etch process and serves to prevent cracking of overlying layers. Then, p-type impurities are predeposited into the source/drain regions 36s and 36i d (note that these regions are designated source/drain in the alternative because their character as source or drain will depend on the way in which they are interconnected in a particular circuit) of the p-channel device by a masking step which selectively opens up these regions. Predeposition may be accomplished by diffusion, ion implantation, sputtering or any related technique. If predeposition is accomplished by diffusion, the as-yet-undefined gate oxide layer 30d prevents any p⁺-source/drain impurities from entering the p-well. The gate electrode 34 serves as a definition mask so that the inner edges of regions 36s and 36d are self-aligned with the edges of the gates. Alignment of the gates with the source/drain regions provides better performance by lowering junction capacitance and also produces decreased device area. Any p-type impurities which reach polycrystalline gates 34 and 35 only slightly affect the heavy n-type phosphorus doping. The n⁺-source/drain diffusion regions for the n-channel device are then formed by diffusion of an n-type conductivity impurity such as phosphorus in a predeposition step. Silicon dioxide is used as a masking material rather than polymer photoresist because it is able to withstand diffusion furnace temperatures. Masking material 40 is then removed by well-known etching techniques.

Figure 6:
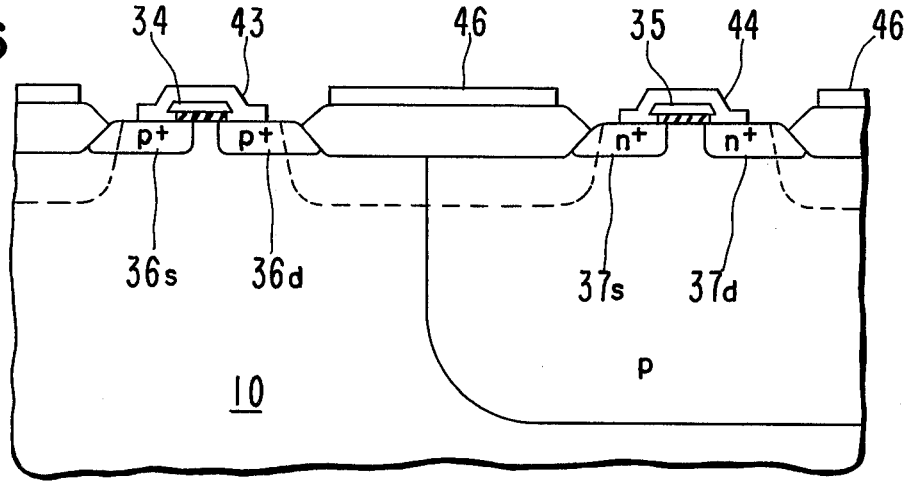
FIG. 6 is a further view of FIG. 5 after thermal drive-in of the $p^+$-source/drain regions 36 and the $n^+$-source/drain regions 37, application of thick oxide layer 46 and definition of polycrystalline silicon gate insulation 43 and 44.

Referring now to FIG. 6, a layer 46 of additional electrical insulating material is formed across the surface of substrate 10 over isolation islands 20. In one embodiment this additional layer of material is formed by chemical deposition. The additional electrical insulation provided by layer 46 inhibits conduction between n-region 37s and n-substrate 10 by increasing the voltage at which inversion of the substrate under oxide island 20 will occur. The drive-in of both p-type and n-type source/drain diffusion regions is then accomplished by heating the substrate to a temperature of about 1070° C. for about one-half hour. The p-well and field implant are only slightly affected because they previously had been driven in by a drive-in at about 1200°C. for about 16 hours.

Figure 7:
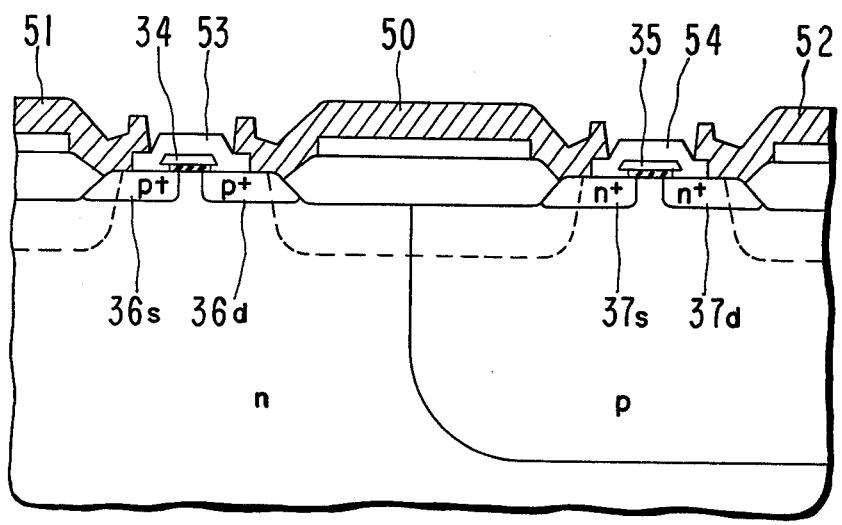
FIG. 7 is a further view of FIG. 6 after conductive connectors have been applied and defined to interconnect one $p^+$-source/drain region of the p-channel device and one $n^+$-source/drain region o the n-channel device and to provide external electrical communication with the remaining source/drain regions.

The complementary field-effect transistor structure is then completed as shown in FIG. 7 by applying conductive connectors and defining them to produce metal layer 50 which interconnects p-region 36d and n-region 37s and metal layers 51 and 52 which provide electrical contact with p-region 36s and n-region 37d, respectively. Interconnection of one source/drain region of the p-channel device and one source/drain region of the n-channel device produces a complementary field-effect circuit with the switching properties described above. In an alternate embodiment, the source/drain regions of complementary devices are not internally connected, in order to allow circuit designers to arrange source/drain interconnections externally. An anneal of the structure in a hydrogen-containing ambient in the temperature range of 350°–500° C. is carried out to minimize the fast interface state density, which also adversely affects threshold voltages and other device characteristics. Finally, scratch-protection layers and packaging is provided in accordance with established practices.

The above-described fabrication process produces an improved oxide-isolated silicon gate complementary field-effect structure. As shown in FIGS. 1–7, an MOS device with a p-channel conductivity type (channel is p-type when device conducts) is formed in active device region 15b and an MOS device with an n-channel conductivity type (channel is n-type when device conducts) is formed in active device region 15d. In one embodiment the source/drain regions are 1.2μ deep, the p-well is 10μ deep, the gate oxide is 0.1μ thick and the gate electrodes 0.4μ thick. Each device is surrounded by isoplanar oxide isolation which is about 1.5μ deep. (From these values it is evident that the FIGURES are pictorial and not drawn to scale.) While oxide-isolated CMOS structures with individual p-wells have been proposed (See R. N. Finella et al., "CMOS III: A High Density Ion Implanted CMOS Technology," Proceedings of the Technical Program, 1971 Semiconductor/IC Processing & Production Conference, pp. 7–10), the particular structure of the present invention has not previously been described or realized. The present invention, for the first time, discloses counter-doping of p-type with n-type impurities in the p-well to produce a high concentration deep within the well to prevent inversion between the n⁺-source/drain regions and the n-substrate, and to produce a low concentration near the surface of the substrate to provide a low threshold voltage for the n-channel device. The mixture of the two impurity types produces a doping profile that has not previously been achived. Also, the fixed charge $Q_{ss}$ in the silicon dioxide near the silicon/silicon dioxide interface is at a reduced level, preferably below $1 \times 10^{11}/cm^2$, so that inversion between the n⁺-source/drain region and the n-substrate is further inhibited. In one embodiment, an operating voltage range of from 3 to more than 15 volts is achieved. The combination of isoplanar oxide isolation and polycrystalline silicon gates results in high density, lower capacitance and a more planar topography. In particular, the doping of the polycrystalline silicon with phosphorus produces a thin layer of glass at the silicon gate/silicon dioxide interface which acts as an alkali getterer and barrier. The polycrystalline silicon gate electrodes are self-aligned with the source/drain regions to produce devices with reduced junction capacitance. The presence of an n-type field implant in the p-well adjacent the oxide isolation islands inhibits inversion of the p-well underneath the isolation islands. Finally, the presence of a chlorine species in the gate and field oxides reduces the likelihood that mobile impurity ions can produce inversion of the substrate or the p-well.

What is claimed is:
1. A process for fabricating a complementary insulated gate field effect transistor structure wherein p-channel and n-channel devices are formed within the same semiconductor substrate, comprising:
   a. applying a thermal oxidation masking material to a layer of n-type silicon including depositing a layer of silicon dioxide and depositing a layer of silicon nitride on said layer of silicon oxide;
   b. defining said thermal oxidation material to establish protected active device regions and to open up isoplanar isolation regions;
   c. introducing a lightly doped n-type impurity in the substrate in isoplanar isolation regions;
   d. heating said semiconductor substrate in the presence of an oxidizing agent to form isolation islands of silicon dioxide;
   e. removing said thermal oxidation masking material;
   f. predepositing n-type and p-type impurities in at least one active device region;
   g. heating said substrate in an atmosphere containing less than 5 percent of an oxidizing agent to drive said n-type and p-type impurities into said substrate to form a composite conductivity well, the relative concentration of said n-type and p-type impurities producing a low net p-type concentration near the surface of said well and high net p-type concentration deep within said well;
   h. thermally growing a thin layer of silicon dioxide in said active device regions;
   i. depositing a conductive layer of polycrystalline silicon;

j. defining said layers of silicon dioxide and polycrystalline silicon to produce insulated gate electrodes for the p-channel and n-channel devices;

k. predepositing boron adjacent both sides of a defined gate electrode in an active device region formed in said layer of n-type silicon to form the source/drain regions of a p-channel field effect device;

l. predepositing phosphorus adjacent both sides of a defined gate electrode in an active device region formed in said composite well to produce the source/drain regions of an n-channel field effect device;

m. thermally driving in said impurities predeposited in said source/drain regions of said p-channel and n-channel devices;

n. forming a further layer of electrical insulation over said isolation islands; and o. applying a conductive layer and defining said conductive layer to connect one of said source-drain regions of said p-channel field effect device and one of said source/drain regions of said n-channel field effect device and to effect external electrical coupling with the remaining source/drain regions of said n-channel and p-channel field effect devices.

2. A process for fabricating a complementary insulated gate field effect transistor structure in accordance with claim 1 wherein the steps of (d) and (h) further comprise heating in the presence of a gas containing a chlorine species.

3. A process for fabricating a complementary insulated gate field effect transistor structure in accordance with claim 2 wherein step (i) further comprises doping said layer of polycrystalline silicon with phosphorus.

* * * * *